(12) United States Patent
Yang

(10) Patent No.: US 8,296,705 B2
(45) Date of Patent: Oct. 23, 2012

(54) CODE TILING SCHEME FOR DEEP-SUBMICRON ROM COMPILERS

(75) Inventor: Chen-Lin Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 269 days.

(21) Appl. No.: 12/683,599

(22) Filed: Jan. 7, 2010

(65) Prior Publication Data

US 2011/0055783 A1 Mar. 3, 2011

Related U.S. Application Data

(60) Provisional application No. 61/237,751, filed on Aug. 28, 2009.

(51) Int. Cl.
*G06F 17/50* (2006.01)
(52) U.S. Cl. ........ 716/122; 716/100; 716/118; 716/119; 716/139
(58) Field of Classification Search .................. 716/100, 716/118, 119, 122, 139
See application file for complete search history.

(56) References Cited

U.S. PATENT DOCUMENTS

| | | | | |
|---|---|---|---|---|
| 5,691,938 A | * | 11/1997 | Yiu et al. | 365/185.11 |
| 5,926,417 A | * | 7/1999 | Chang | 365/185.26 |
| 6,002,607 A | * | 12/1999 | Dvir | 365/103 |
| 6,259,622 B1 | * | 7/2001 | Fried et al. | 365/94 |
| 6,480,432 B1 | * | 11/2002 | Nakayama | 365/201 |
| 6,617,621 B1 | * | 9/2003 | Gheewala et al. | 257/207 |
| 6,853,572 B1 | * | 2/2005 | Sabharwal | 365/63 |
| 7,002,827 B1 | * | 2/2006 | Sabharwal et al. | 365/94 |
| 2004/0115995 A1 | | 6/2004 | Sanders | |

* cited by examiner

*Primary Examiner* — Sun Lin
(74) *Attorney, Agent, or Firm* — Duane Morris LLP

(57) ABSTRACT

A method includes receiving instructions for designing a ROM array, generating netlists for the ROM array, generating a data file representing a physical layout of the ROM array on a semiconductor wafer, and storing the data file in a computer readable storage medium. The instructions for the ROM array define a layout for a first unit including a first bit cell coupled to a first word line, a bus that may be coupled and uncoupled to a first power supply having a first voltage level, a layout for a second unit coupled to a second word line, and a layout for a third unit having an isolation device and being configured to share a bit line contact with the second unit or another third unit. The layout for the second unit is configured to be arranged at an edge of the ROM array and includes a dummy device.

19 Claims, 13 Drawing Sheets

CODE TILING SCHEME FOR DEEP-SUBMICRON ROM COMPILERS

CROSS-REFERENCE TO RELATED APPLICATIONS

This application claims priority to U.S. Provisional Patent Application No. 61/237,751 filed Aug. 28, 2009, which is expressly incorporated by reference herein in its entirety.

FIELD OF DISCLOSURE

The disclosed systems and methods relate to memory devices. More specifically, the disclosed systems and methods relate to read only memory (ROM) devices.

BACKGROUND

Current ROM bit cell tiling for arbitrary codes is done by tiling basic code0 cells and/or code1 cells. FIGS. 1A and 1B show design schematics of code0 and code1 bit cells, respectively. As shown in FIG. 1A, a code0 cell is typically implemented as a single MOSFET having its gate tied to a word line (WL) and its drain connected to a coding node. The bit line (BL) of the code0 node is set to a floating voltage representing a logic zero. A code1 cell also includes a MOSFET having its source coupled to $V_{SS}$ and its gate tied to a WL as shown in FIG. 1B. The drain of the MOSFET in the code1 cell is coupled to a BL, such that when the MOSFET is turned on, $V_{SS}$ is coupled to the BL. The turning on and off of the MOSFETs illustrated in FIGS. 1A and 1B are controlled by the WLs, which provide logic ones or zeroes to the gates of the MOSFETs.

The tiling of code0 and code1 cells described above is compatible with masked ROM cells with isolated oxide definition (OD) islands for each bit cell. FIG. 2A illustrates one example of layout of bit cells using the masked ROM with isolated OD islands. However, these conventional layouts suffer from long OD (LOD) effect, polysilicon (poly) spacing effect (PSE), and OD spacing effect (OSE), all of which cause device degradation. FIG. 2B is a graph of NMOS Idsat versus surface area (μm) for the bit cell layout illustrated in FIG. 2A. As shown in FIG. 2B, the smaller the surface area of the bit cell layout, the greater the degradation as seen by the sharp roll-off region at the left of the graph. FIG. 2C is a graph of NMOS Dldsat versus spacing (μm) for the bit cell layout illustrated in FIG. 2A. As shown in FIG. 2C, the device degradation increases as the spacing between OD islands increases in a lengthwise direction in the layout illustrated in FIG. 2A.

Accordingly, a improved method for laying out a ROM is desirable.

SUMMARY

In one embodiment, a method includes receiving instructions for designing a ROM array, generating netlists for the ROM array, generating a data file representing a physical layout of the ROM array on a semiconductor wafer, and storing the data file in a computer readable storage medium. The instructions for the ROM array define a layout for a first unit including a first bit cell coupled to a first word line, a bus that may be coupled and uncoupled to a first power supply having a first voltage level, a layout for a second unit coupled to a second word line, and a layout for a third unit having an isolation device and being configured to share a bit line contact with the second unit or another third unit. The layout for the second unit is configured to be arranged at an edge of the ROM array and includes a dummy device.

In another embodiment, an electronic design automation (EDA) system includes a computer readable storage medium and a processor in data communication with the computer readable storage medium. The processor is configured to receive instructions for designing a ROM array, generate netlists for the ROM array, and generate a data file representing a physical layout of the ROM array on a semiconductor wafer. The instructions for the ROM array define a layout for a first unit including a first bit cell coupled to a first word line, a bus that may be coupled and uncoupled to a first power supply having a first voltage level, a layout for a second unit coupled to a second word line, and a layout for a third unit having an isolation device and being configured to share a bit line contact with the second unit or another third unit. The layout for the second unit includes a dummy device and is configured to be arranged at an edge of the ROM array.

DETAILED DESCRIPTION

Figures 1A, 1B:
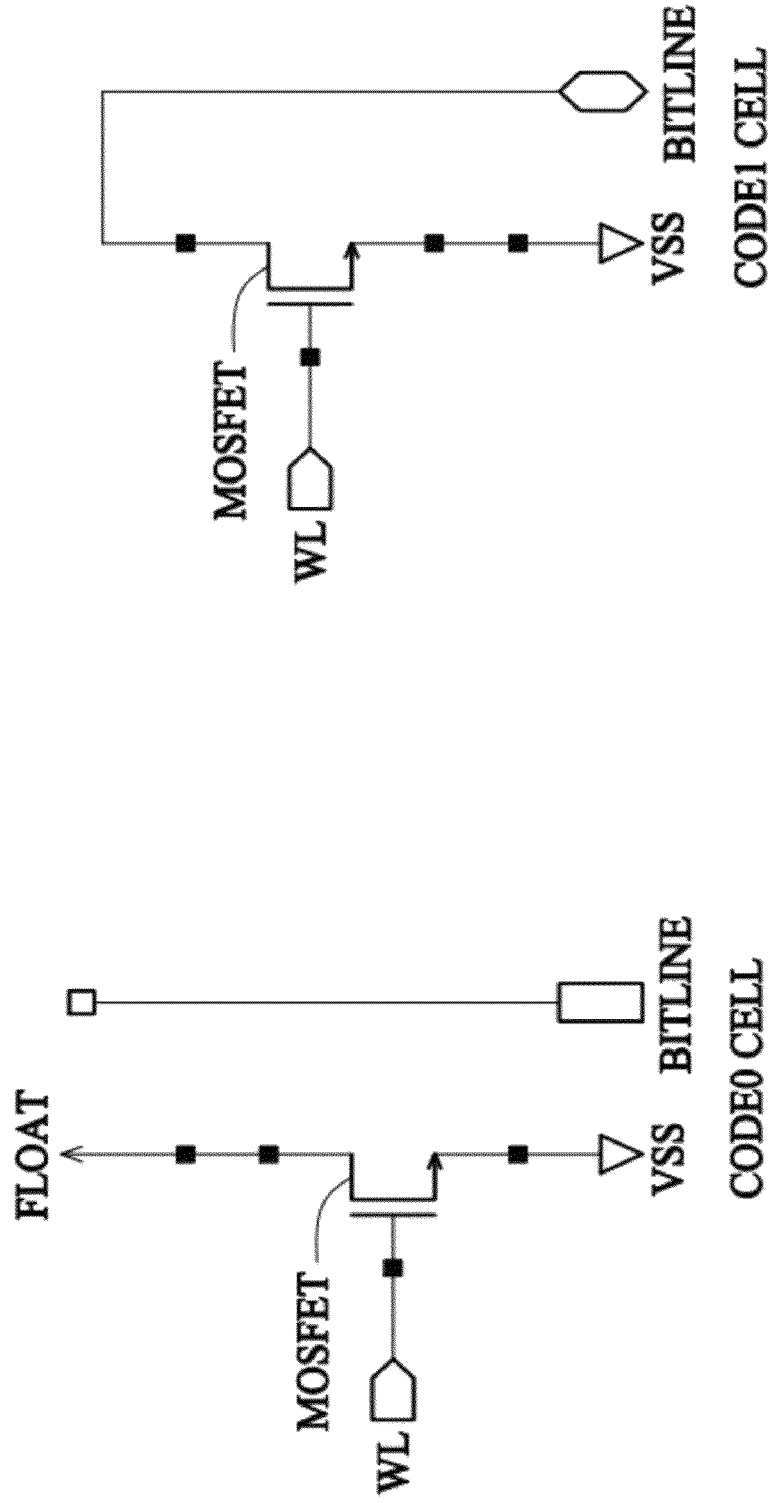
FIG. 1A illustrates an example of a code0 cell.
FIG. 1B illustrates one example of a code1 cell.
Figure 2A:
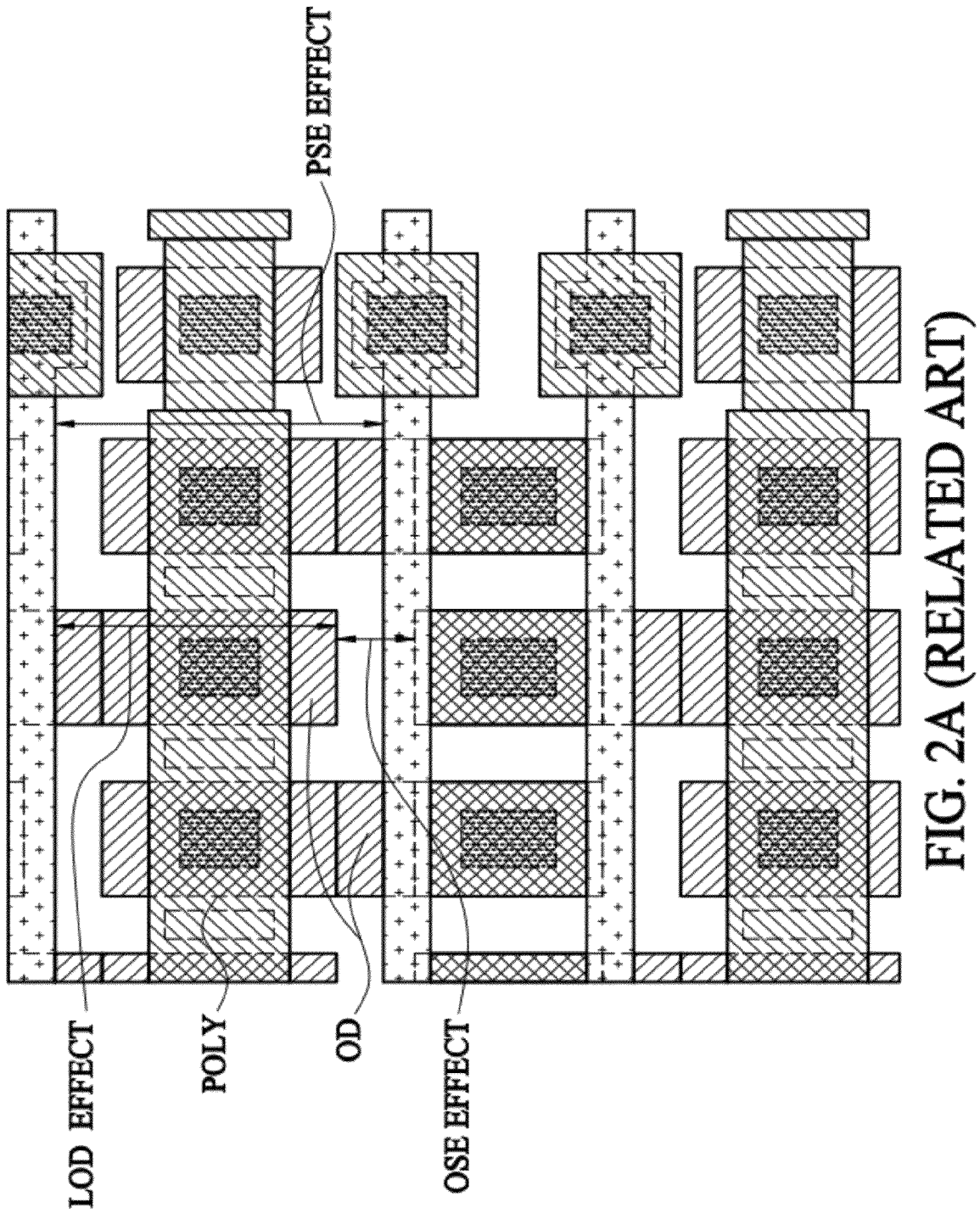
FIG. 2A illustrates one example of a conventional ROM layout using OD islands.
Figure 2B:
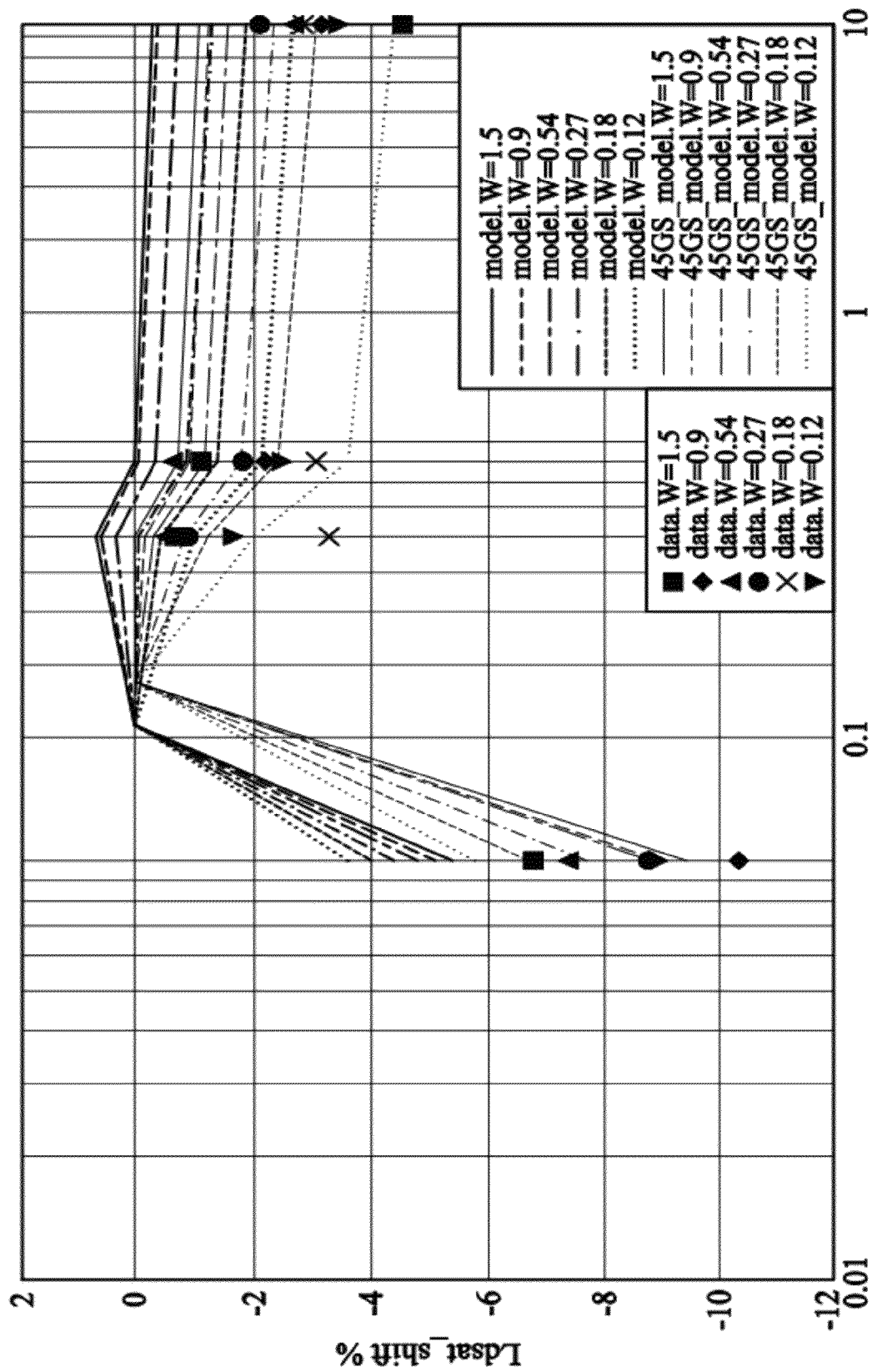
FIG. 2B is a graph illustrating degradation versus surface area for the ROM layout illustrated in FIG. 2A.
Figure 2C:
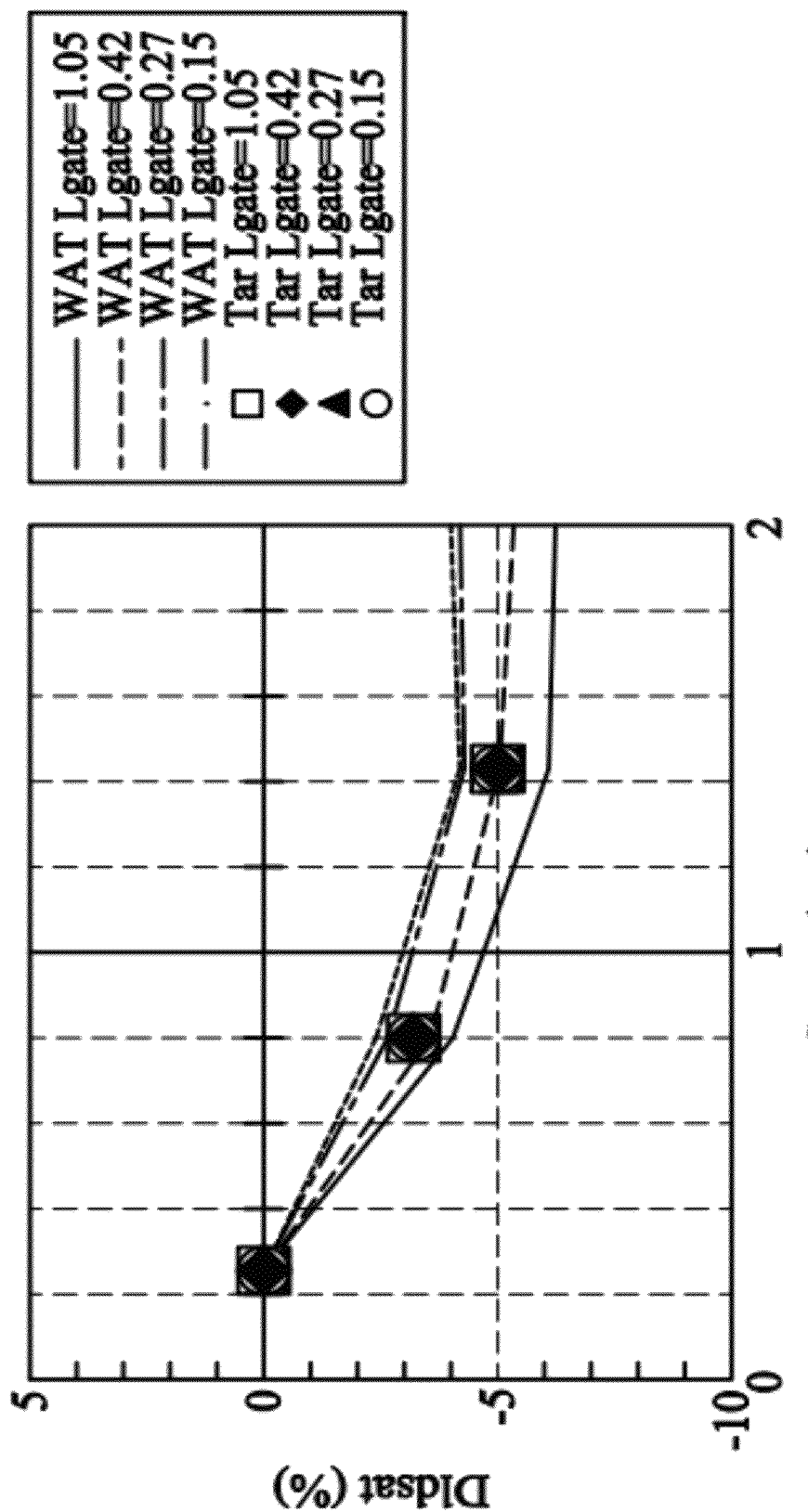
FIG. 2C is a graph illustrating degradation versus spacing for the ROM layout illustrated in FIG. 2A.
Figure 3:
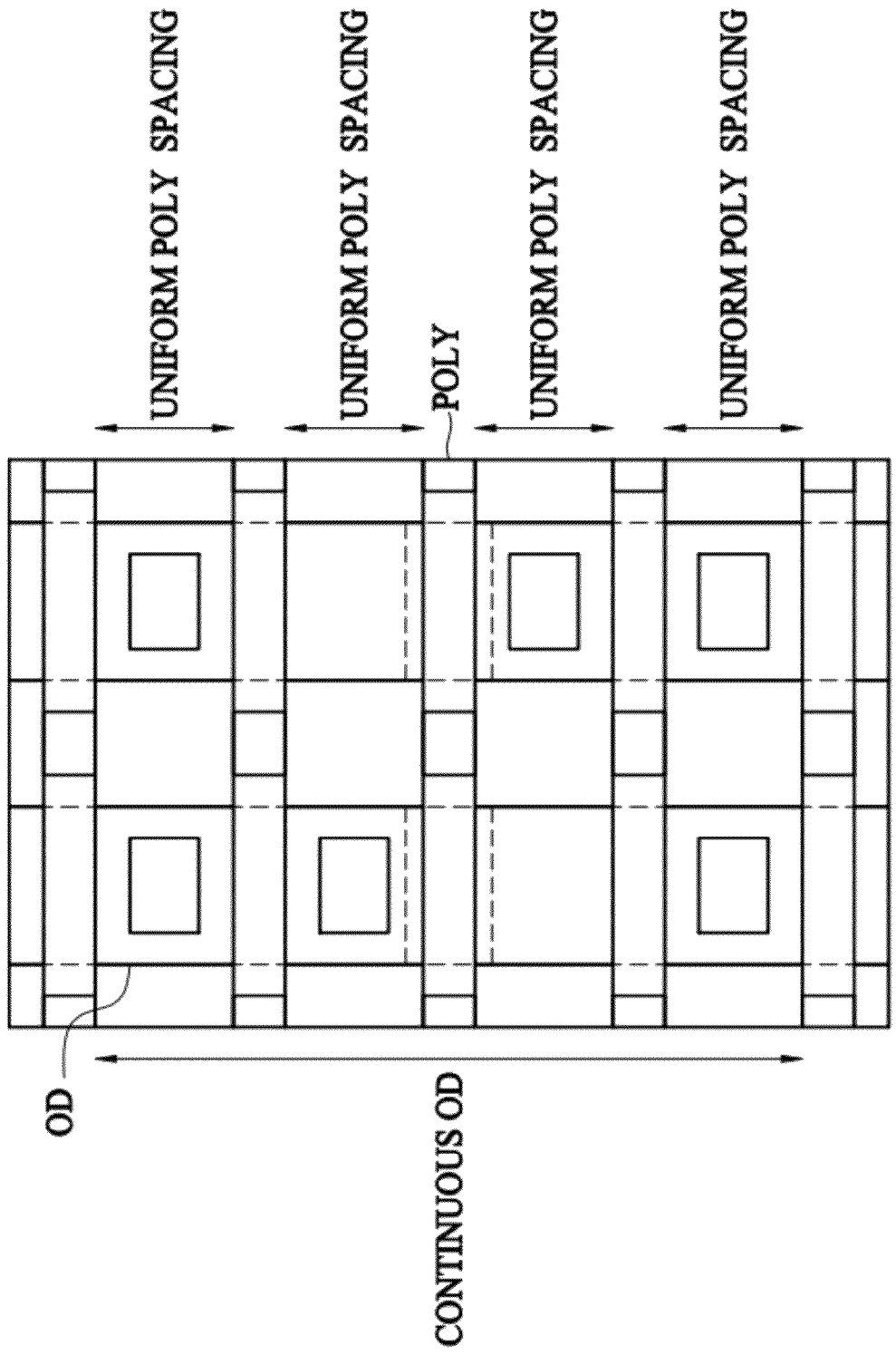
FIG. 3 illustrates one example of a ROM layout using continuous OD and equally spaced poly.

In advanced technologies, e.g., technologies below 32 nm, OD islands may be replaced with a continuous OD and the dummy devices comprising grounded polysilicon are uniformly spaced to limit the degradations caused by LOD, OSE, and PSE effects described above. One example of a bit cell layout having continuous OD and uniform poly spacing is illustrated in FIG. 3. Grounded poly, e.g., a polysilicon gate coupled to ground, is typically used as a dummy device for bit-to-bit isolation in sub-32 nm technology for preventing a bit cell from being shorted, e.g., a code1 bit cell being shorted to a code0 or vice versa. These dummy devices are implemented since the OD is no longer arranged with isolated islands.

Figure 4:
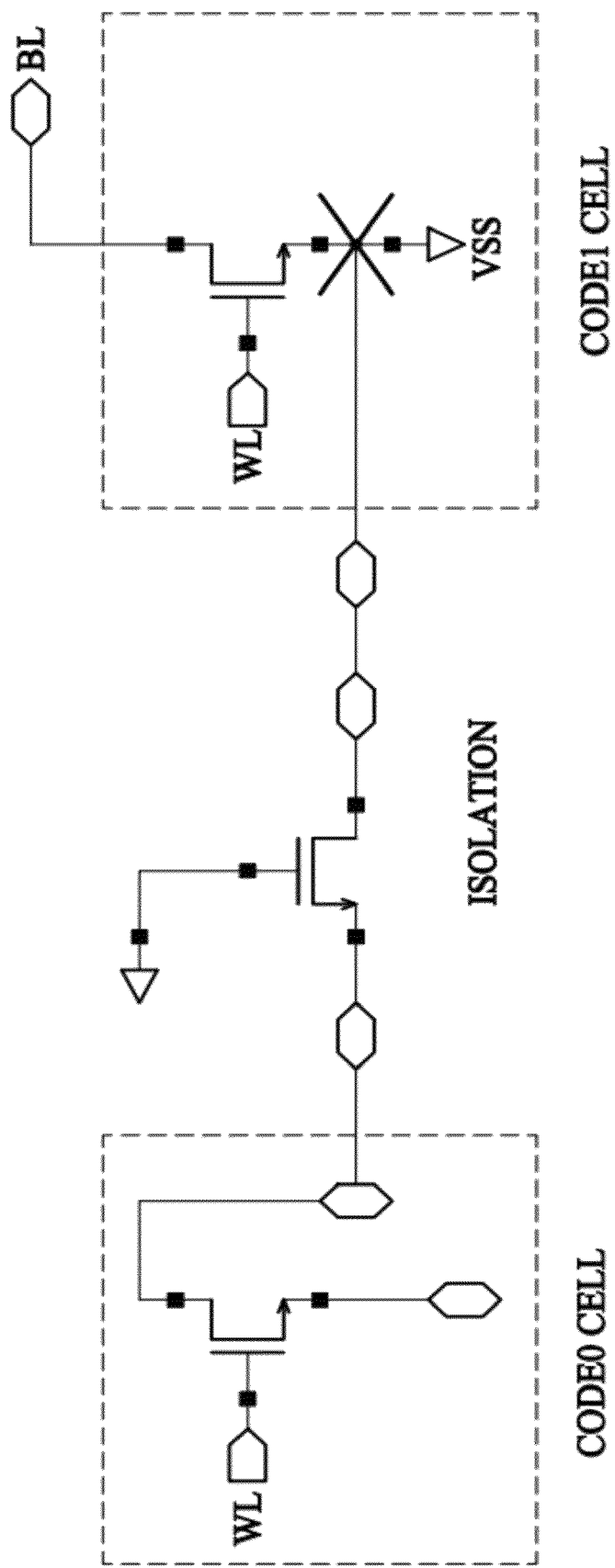
FIG. 4 illustrates one example of a code0 cell coupled to a code1 through an isolation device that is not allowed by compiler software.

However, modeling the grounded poly dummy devices using continuous OD in a schematic causes problems when building the netlists for a ROM compiler, which is used to generate a data file, such as, for example, a graphic data system (GDS) or a GDSII file, for customized random ROM data. For example, a conventional netlisting algorithm does not allow for any cell within cell $V_{SS}$ to be shorted to any cell port that is coupled to an isolation device, such as the arrangement illustrated in FIG. 4. Instead, $V_{SS}$ is applied at a higher level in the schematic hierarchy to prevent a designer from having a bit cell shorted in the final layout. Additionally, although isolation cells may be shared in the actual layout of the ROM, this cannot be done in the schematic as it requires two separate isolation cells instead of the single isolation cell.

The disclosed ROM layout and method described herein provide a way to decompose arbitrary ROM codes into reusable netlist paragraphs in which isolation and dummy devices using continuous OD may be modeled. The algorithm may be included in ROM compiler software for netlist and GDS/GDSII file generation for random configurations. Additionally, the improved method enables a layout versus schematic (LVS) check on the improved ROM array layout by generating a complete netlist representing a circuit, where the netlist includes each dummy device providing an array with enhanced quality.

Figure 5A:
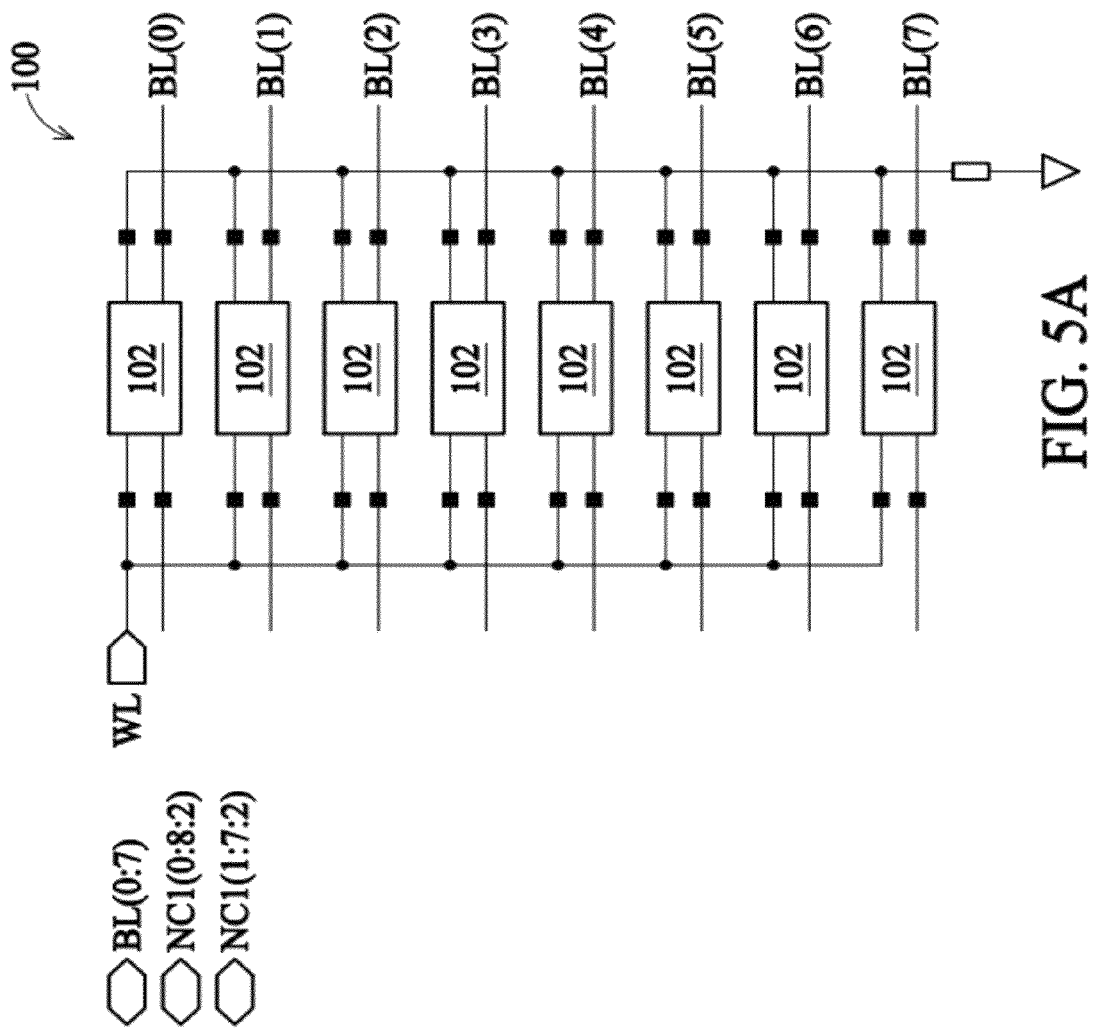
FIG. 5A illustrates one example of a universal cell in accordance with an improved ROM layout.
Figure 5B:
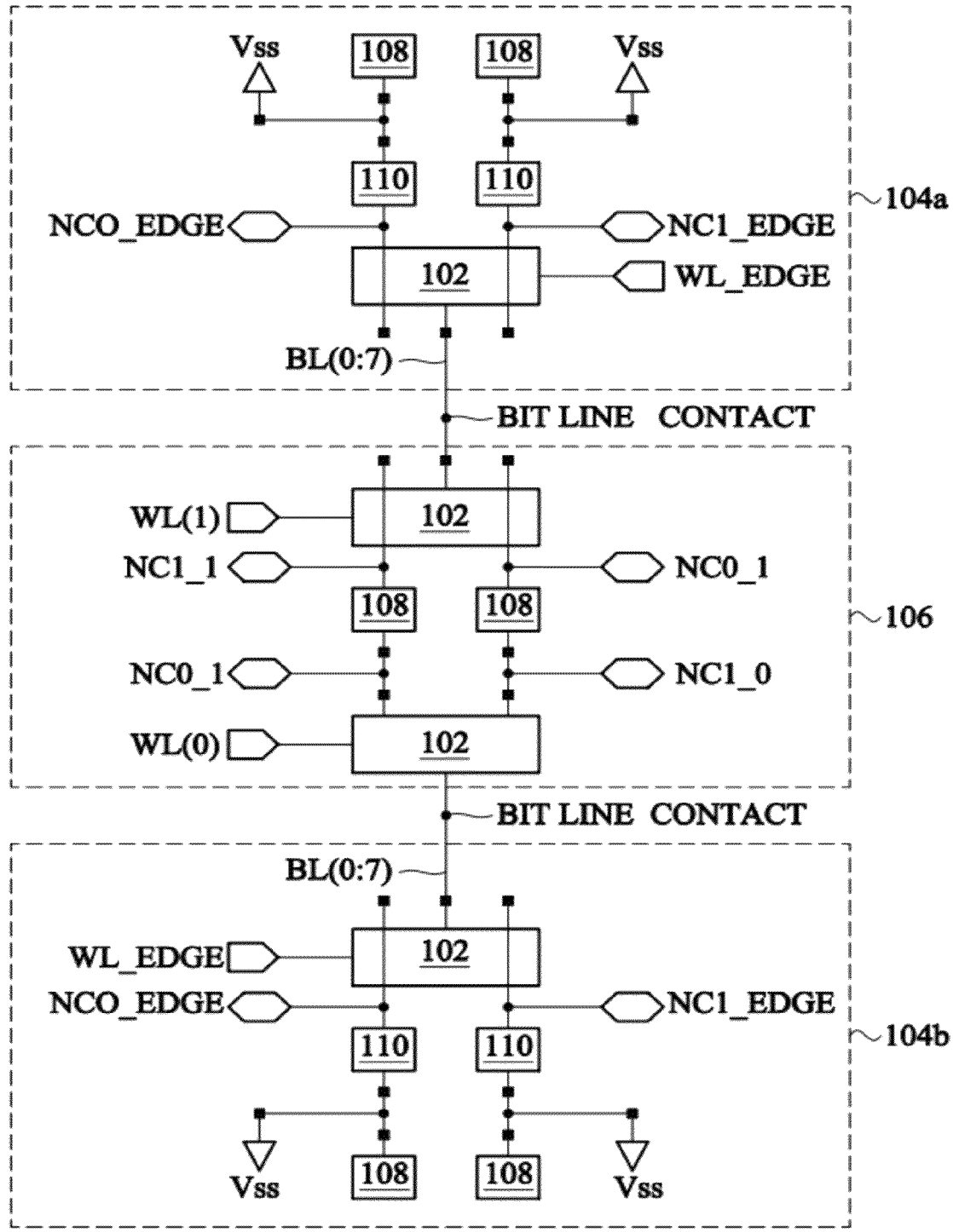
FIG. 5B illustrates one example of a repeatable unit and an edge unit in accordance with an improved ROM layout.
Figure 5C:
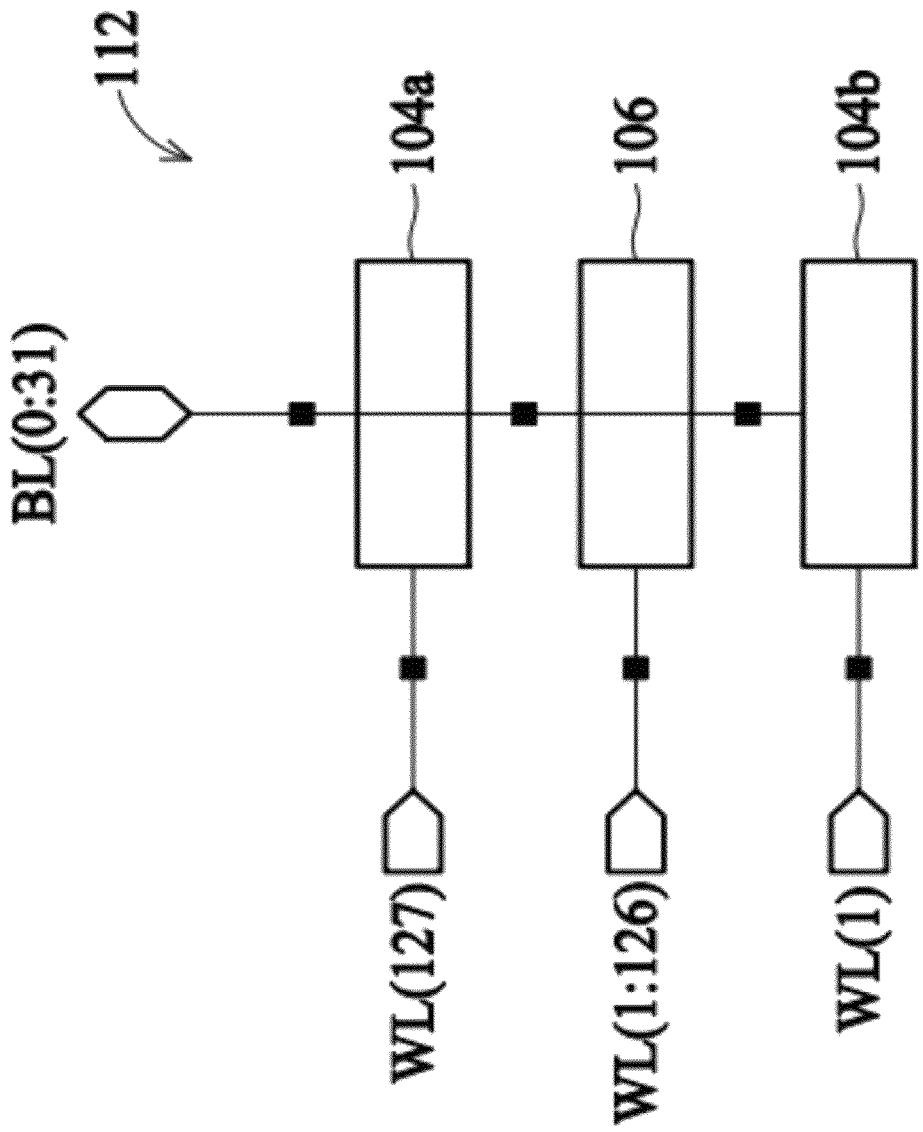
FIG. 5C illustrates one example of a high level view of an improved ROM array including a universal unit in accordance with FIG. 5A and edge and repeatable units in accordance with FIG. 5B.
Figure 7:
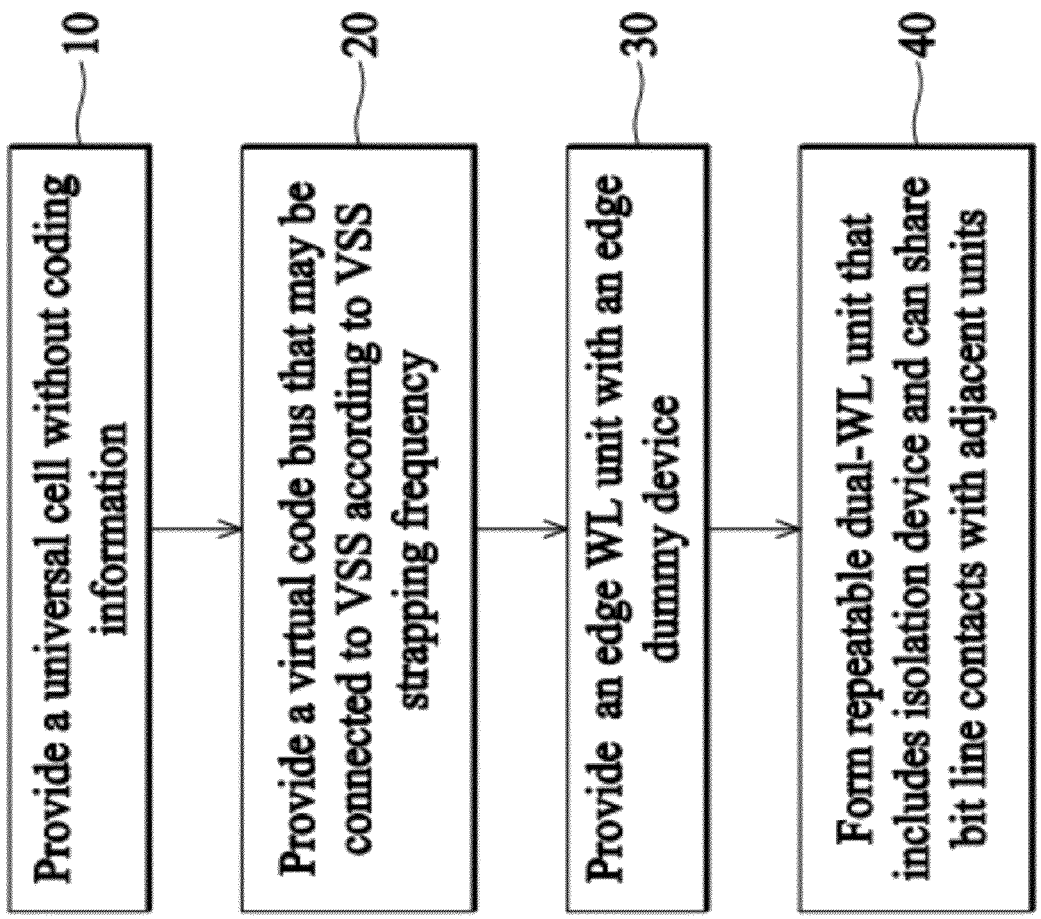
FIG. 7 is a flow diagram of one example of an algorithm for decompiling a ROM codes into the plurality of units illustrated in FIGS. 5A-5B.

FIGS. 5A-5C illustrate one example of an improved ROM layout, and FIG. 7 illustrates one example of an algorithm for decomposing arbitrary ROM codes into the plurality of units illustrated in FIGS. 5A-5B, which are used as components for constructing a ROM array. As shown in FIG. 7, a universal cell or unit is provided without bit cell coding information at block 10. One example of a universal unit 100 is illustrated in FIG. 5A. As shown in FIG. 5A, the universal unit 100 may include a plurality of bit cells 102 each coupled to a word line (WL) and a respective bit line (BL), e.g., BL(0)-BL(7).

At block 20, a "virtual" code bus, e.g., nodes NC1_0, NC1_1, NC0_0, and NC0_1, is provided that can be connected to $V_{SS}$ according to the $V_{SS}$ strapping frequency of the ROM. The virtual code bus is not identifiable in the final netlists. Instead, NC1 is identified as $V_{SS}$ and NC0 is listed as intermediate nodes between a bit cell and an isolation device.

At block 30, an edge unit 104 is provided. One example of an edge unit 104 is illustrated in FIG. 5B. As shown in FIG. 5B, the top and bottom edge units 104a, 104b include a bit cell 102 coupled to isolation devices 110, each of which are coupled to $V_{SS}$ and to an edge isolation device 108. Bit cell 102 is coupled to a WL, WL_EDGE, and to coding signals NC0_EDGE and NC1_EDGE. Coding signals NC0_EDGE and NC1_EDGE may be coupled to the virtual coding bus configured to provide random inputs of logic zeroes and ones.

At block 40, a repeatable unit that includes a pair of WLs and an isolation device and that can share bit line contacts with adjacent units is formed at block 30. One example of such a repeatable unit 106 is illustrated in FIG. 5B. As shown in FIG. 5B, repeatable unit 106 includes two bits cells 102 separated by isolation devices 108. One bit cell 102 is coupled to a first WL, WL(1), and is configured to receive coding signals NC1_1 and NC0_1. The other bit cell 102 is coupled to a second WL, WL(2), and is configured to receive coding signals NC0_1 and NC1_0. Coding signals NC0_1 and NC1_0 may be coupled to the virtual coding bus configured to provide random inputs of logic zeroes and ones. Each of the bit cells 102 of the repeatable unit 106 may be coupled to another repeatable unit or to the top or bottom edge units 104a, 104b through a BL contact, which may be transparent in the schematic building environment. A ROM array including a plurality of rows and columns of bit cells may be designed using the repeatable unit 106 and top and bottom edge units 104a, 104b as the minimal building blocks. These additional columns of bit cells are not illustrated to simplify the figures.

FIG. 5C illustrates one example of a high-level schematic of a ROM array 112 including 128 WLs and 32 BLs. As shown in FIG. 5C, the ROM array 112 includes a top edge unit 104a, a bottom unit 104b, and a plurality of repeatable units 106, e.g., 63 repeatable units, coupled together. One skilled in the art will understand that other array combinations are possible including, but not limited to, a 14×9 array and an 18×7 array.

Figure 6:
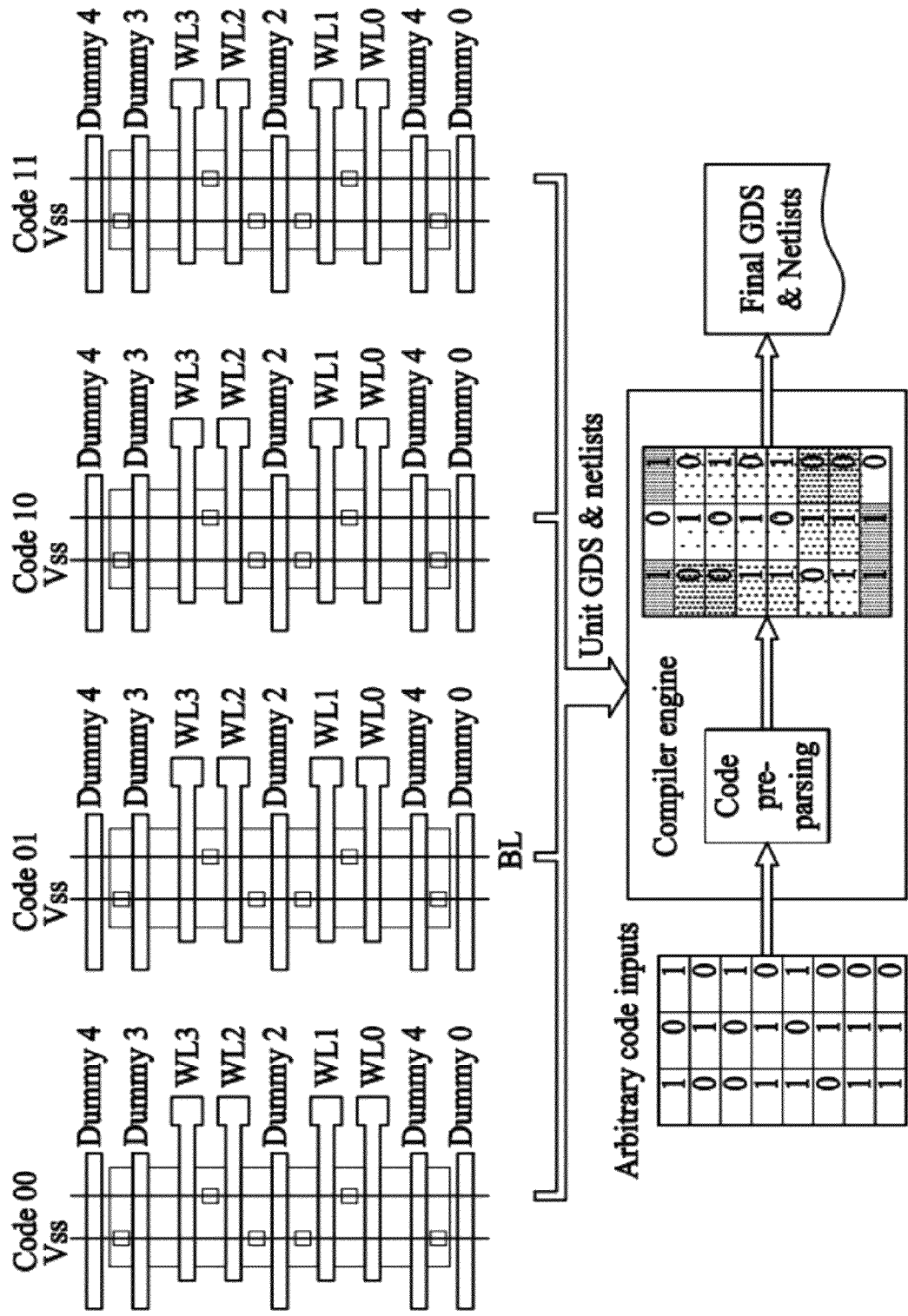
FIG. 6 illustrate one example of a compiler

The ROM layout 112 described above with respect to FIGS. 5A-5C may be used to write netlists for a complier of an electronic design automation (EDA) system, such as those marketed by Synopsis, Inc. of Mountain View, Calif. or Cadence Design Systems, Inc. of San Jose, Calif. The compiler software may be used to perform pre-parsing for random or free format text user inputs such as those illustrated in FIG. 6. The random or free format text inputs may be used to complete the netlists and create a GDSII file by tiling the bit cells as illustrated in FIG. 6 according to codes 00, 01, 10, 11, edge0, and edge1.

Figure 8:
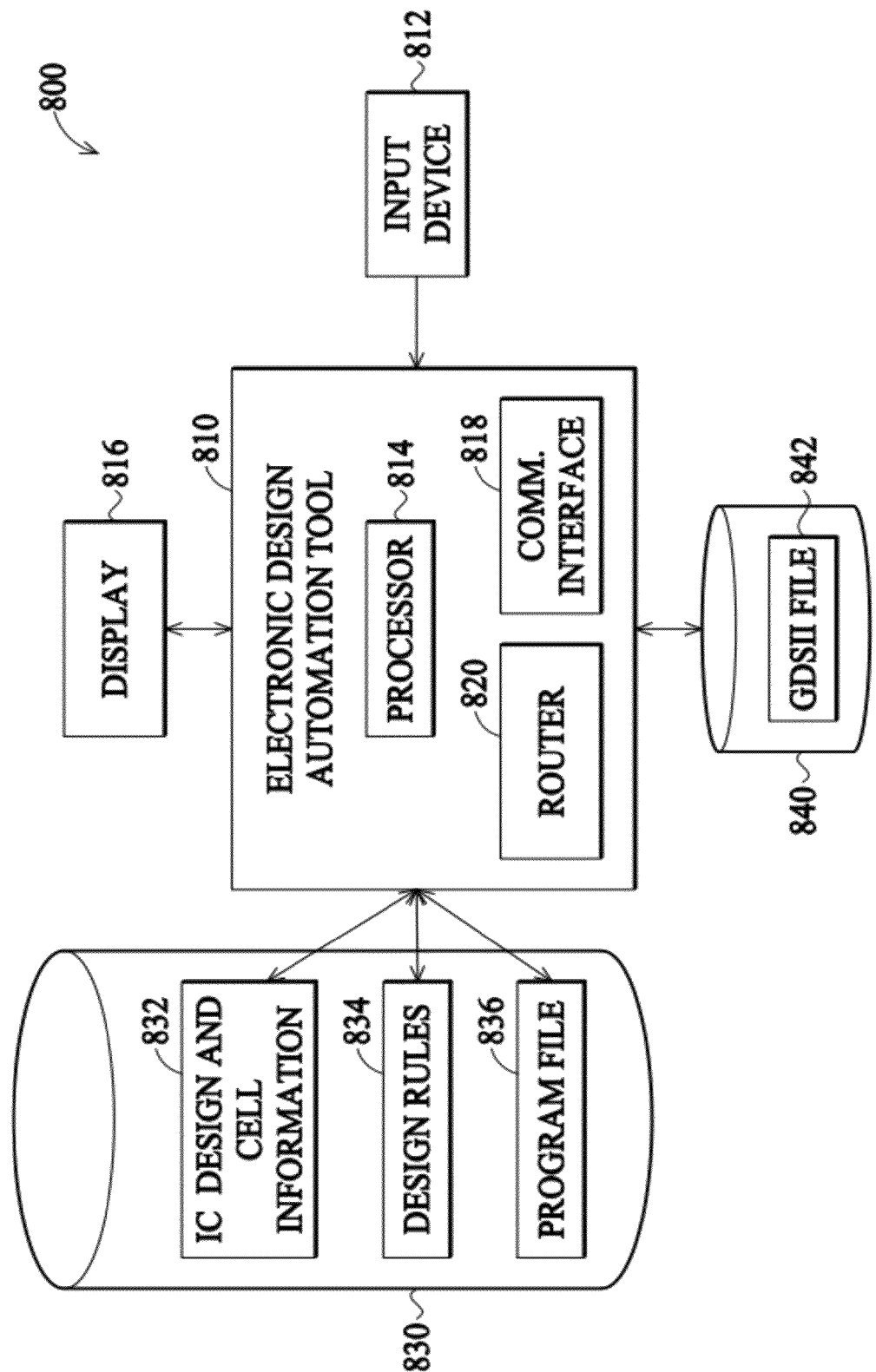
FIG. 8 is a block diagram of one example of a system having an electronic design automation tool.

FIG. 8 is a block diagram of one example of a system 800 including an EDA tool 810 such as "IC COMPILER"™, sold by Synopsis, Inc. of Mountain View, Calif., having a router 820 such as "ZROUTE"™, also sold by Synopsis. Other EDA tools 810 may be used, such as, for example, the "VIRTUOSO" custom design platform or the Cadence "ENCOUNTER"® digital IC design platform along with the "VIRTUOSO" chip assembly router 820, all sold by Cadence Design Systems, Inc. of San Jose, Calif.

The EDA tool 810 is a special purpose computer formed by retrieving stored program instructions 836 from a computer readable storage medium 830, 840 and executing the instructions on a general purpose processor 814. Processor 814 may be any central processing unit (CPU), microprocessor, microcontroller, or computational device or circuit for executing instructions. The computer readable storage medium 830, 840 may be a random access memory (RAM) and/or a more persistent memory, such as a ROM. Examples of RAM include, but are not limited to, static random-access memory (SRAM), or dynamic random-access memory (DRAM). A ROM may be implemented as a programmable read-only memory (PROM), an erasable programmable read-only memory (EPROM), or an electrically erasable programmable read-only memory (EEPROM) as will be understood by one skilled in the art.

System 800 may include a display 816 and user interface or input device 812 such as, for example, a mouse, a touch screen, a microphone, a trackball, a keyboard, or like device through which a user may input design instructions. The one or more computer readable storage mediums 830, 840 may store data input by a user, a GDSII file 842, IC design and cell information 832, and design rules 834. Additionally, EDA tool 810 may include a communication interface 818 allowing software and data to be transferred between EDA tool 810 and external devices. Examples of a communications interface 818 may include a modem, Ethernet card, wireless network card, a Personal Computer Memory Card International Association (PCMCIA) slot and card, or the like. Software and data transferred via communications interface 818 may be in the form of signals, which may be electronic, electromagnetic, optical, or the like that are capable of being received by communications interface 818. These signals may be provided to communications interface 818 via a communications path (e.g., channel), which may be implemented using wire, cable, fiber optics, a telephone line, a cellular link, a radio frequency (RF) link and other communication channels.

The router 820 is capable of receiving an identification of a plurality of cells to be included in an integrated circuit (IC) layout, including a list 832 of pairs of cells within the plurality of cells to be connected to each other. A set of design rules 834 may be used for a variety of technology nodes (e.g., technology greater than, less than, or equal to 32 nm). In some embodiments, the design rules 834 configure the router 820 to locate connecting lines and vias on a manufacturing grid. Other embodiments may allow the router to include off-grid connecting lines and/or vias in the layout.

Figure 9:
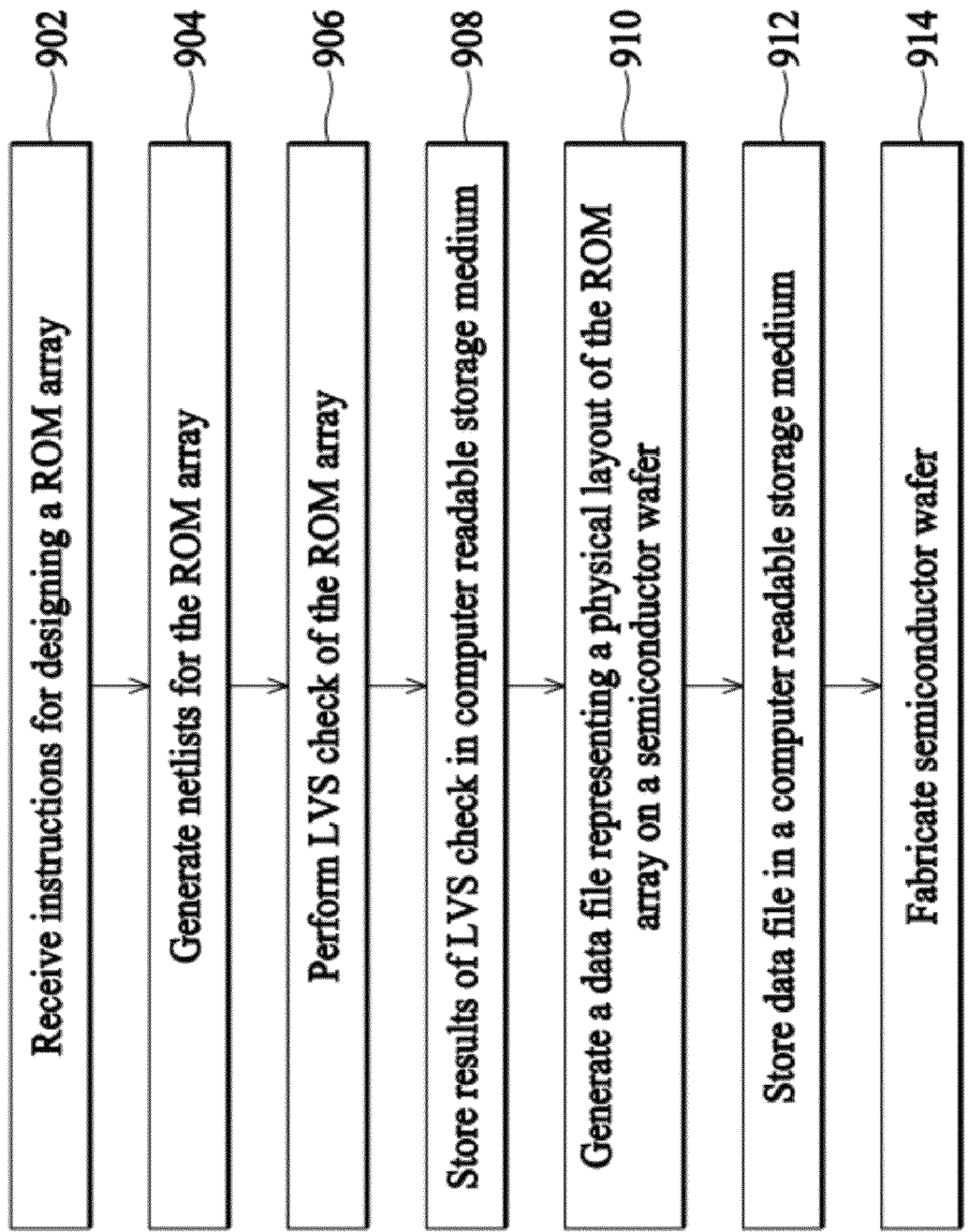
FIG. 9 is a flow diagram of one example of a method that may be performed by the system illustrated in FIG. 8.

FIG. 9 illustrates one example of a method performed by EDA tool 810. At block 902, the EDA tool 810 receives instructions for designing a ROM array 112. The instructions may be received from a user through the input device 812 shown in FIG. 8. As described above, the ROM array may include a layout for a universal cell 100, a virtual code bus, e.g., nodes NC1_0, NC1_1, NC0_0, and NC0_1, one or more repeatable units 106, and one or more edge units 104a, 104b. In some embodiments, the instructions may be loaded into the EDA tool 810 from a computer readable storage media such as, for example, a CD-ROM, DVD-ROM, Blu-ray ROM, flash memory device, or the like by way of a corresponding drive or interface. In some embodiments, the instructions may be received through the communication interface 818 such as a wireless connection or a wired connection such as an Ethernet or like connection.

At block 904, netlists are generated for the ROM array 112, and an LVS check of the ROM array is performed at block 906. The results of the LVS check may be stored in a computer readable storage medium 830, 840 at block 908.

At block 910, a data file, such as a GDSII file, including data representing a physical layout of the ROM array on a semiconductor wafer is generated. The data file is stored in a computer readable storage medium 830, 840 at block 912, and may used by mask making equipment, such as an optical pattern generator, to generate one or more masks for ROM array. At block 914, router 820 may fabricate the ROM array on a semiconductor wafer as will be understood by one skilled in the art.

The improved ROM layout described above advantageously reduces layout-effect induced device degradation and the associated process variations. Additionally the ROM layout described above provides reusable netlist paragraphs in which isolation and dummy devices may be modeled such that they may be checked by LVS or another tool that performs layout-versus-schematic checks, thereby enhancing the quality of an array.

The present invention may be at least partially embodied in the form of computer-implemented processes and apparatus for practicing those processes. The present invention may also be at least partially embodied in the form of computer program code embodied in tangible machine readable storage media, such as random access memory (RAM), read only memories (ROMs), CD-ROMs, DVD-ROMs, BD-ROMs, hard disk drives, flash memories, or any other machine-readable storage medium, wherein, when the computer program code is loaded into and executed by a computer, the computer becomes an apparatus for practicing the invention. The present invention may be embodied at least partially in the form of computer program code, whether loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The invention may alternatively be at least partially embodied in a digital signal processor formed of application specific integrated circuits for performing a method according to the principles of the invention.

Although the disclosed system and method have been described in terms of exemplary embodiments, they are not limited thereto. Rather, the appended claims should be construed broadly, to include other variants and embodiments of the system and method, which may be made by those skilled in the art without departing from the scope and range of equivalents of the system and method.

What is claimed is:

1. A method, comprising:
receiving instructions for designing a ROM array by an electronic design automation tool including a processor and a non-transitory computer readable storage medium, the instructions for the ROM array defining:
a layout for a first unit including a first bit cell coupled to a first word line,
a bus configured to be coupled or uncoupled to a first power supply having a first voltage level,
a layout for a second unit coupled to a second word line, the layout for the second unit including a dummy device and being configured to be arranged at an edge of the ROM array, and
a layout for a third unit having an isolation device and configured to share a bit line contact with the second unit or another third unit;
generating netlists for the ROM array;
generating a data file representing a physical layout of the ROM array on a semiconductor wafer; and
storing the data file in the non-transitory computer readable storage medium.

2. The method of claim 1, wherein the layout of the first unit includes a plurality of bit cells; each H of the plurality of bit cells coupled to a third word line.

3. The method of claim 1, wherein the data file is a GDSII file; the method further comprising:
fabricating the ROM array on a semiconductor wafer based on the GDSII file.

4. The method of claim 1, further comprising:
performing a layout versus schematic (LVS) check of the ROM array; and
storing a result of the LVS check in the non-transitory computer readable storage medium.

5. The method of claim 1, wherein the layout of the third unit a second bit cell and a third bit cell each coupled to a respective word line, the second bit cell and the third bit cell separated by a second isolation device.

6. The method of claim 5, wherein each of the second and third bit cells are configured to be coupled to a bit line contact.

7. The method of claim 1, wherein the layout of the second unit includes a second bit cell coupled to an edge isolation device.

8. An electronic design automation (EDA) system comprising:
a non-transitory computer readable storage medium; and
a processor in data communication with the non-transitory computer readable storage medium, the processor configured to:
receive instructions for designing a ROM array, the instructions for the ROM array defining:
a layout for a first unit including a first bit-cell coupled to a first word line,
a bus configured to be coupled or uncoupled to a first power supply having a first voltage level, a layout for a second unit configured to be disposed at an edge of the ROM array and coupled to a second word line, the layout for the second unit including a dummy device, and a layout for a third unit having an isolation device and configured to share a bit line contact With one of the second unit or another third unit;

generate netlists for the ROM array; and generate a data file representing a physical layout of the ROM array on a semiconductor wafer.

9. The EDA system of claim 8, wherein the data file is a GDSII file, and the processor is configured to store the GDSII file in the non-transitory computer readable storage medium.

10. The EDA system of claim 8, wherein the layout of the first unit includes a plurality of bit cells, each of the plurality of bit cells coupled to a third word line.

11. The EDA system of claim 8, wherein the dummy device represents grounded polysilicon.

12. The EDA system of claim 8, wherein the processor is configured to perform a layout versus schematic (LVS) check of the ROM array; and store a result of the LVS cheek in the computer readable storage medium.

13. The EDA system of claim 8, wherein the layout of the third unit includes second and third bit cells each coupled to a respective word line, the second and third bit cells separated by a second so isolation device.

14. The EDA system of claim 13, wherein each, of the second and third bit cells are configured to be coupled to a bit line contact.

15. The EDA system of claim 9, wherein the layout of the second unit includes a second memory cell coupled to an edge isolation device.

16. A non-transitory computer readable storage medium encoded with computer program code, such that when the computer program code is: executed by a processor, the processor method comprising:

receiving instructions for designing a ROM array, the instructions for the ROM array defining:

a layout for a first unit including a first bit cell coupled to a first word line, a bus configured to be coupled or uncoupled to a first power supply haying a first voltage level, a layout for a second unit coupled to a second word line, the layout for the second unit including a dummy device, and layout for a third unit having an isolation device and configured to share a bit line, contact with the second unit or another third unit;

generating netlists for the ROM array; and generating a data file representing a physical layout of the ROM array on a semiconductor wafer.

17. The computer non-transitory readable storage medium of claim 16, wherein the layout of the first unit includes a plurality of bit cells, each of the plurality of bit cells coupled to a third word line.

18. The non-transitory computer readable storage medium of claim 16, wherein the method includes:

performing a layout versus schematic (LVS) check of the ROM array; and storing a result of the LVS check in the computer readable storage medium.

19. The non-transitory readable storage medium of claim 16, wherein the layout of the third unit includes a second bit cell and a third bit cell each coupled to a respective word line, the second bit cell and the third bit cell separated by a second isolation device.

* * * * *

UNITED STATES PATENT AND TRADEMARK OFFICE
CERTIFICATE OF CORRECTION

| | |
|---|---|
| PATENT NO. | : 8,296,705 B2 |
| APPLICATION NO. | : 12/683599 |
| DATED | : October 23, 2012 |
| INVENTOR(S) | : Chen-Yin Lang |

It is certified that error appears in the above-identified patent and that said Letters Patent is hereby corrected as shown below:

IN THE CLAIMS:

Claim 2, Column 6, Line 36, delete the ";" after "cells" and delete "H" after "each".

Claim 3, Column 6, Line 39, delete the ";" after "file" and insert -- , --.

Claim 8, Column 7, Line 6, delete the word "With" and insert -- with --.

Claim 12, Column 7, Line 24, delete the word "cheek" and insert -- check --.

Claim 13, Column 7, Line 29, delete the word "so" after "second".

Claim 14, Column 7, Line 30, delete the "," after "each".

Claim 16, Column 8, Line 3, delete the ":" after "is".

Claim 16, Column 8, Line 4, insert -- performs a -- before the word "method".

Claim 16, Column 8, Line 10, delete the word "haying" and insert -- having --.

Claim 17, Column 8, Line 20, delete the word "computer" after "The" and insert -- computer -- after the word "non-transitory".

Claim 19, Column 8, Line 30, after the word "non-transitory", insert -- computer --.

Signed and Sealed this
Nineteenth Day of February, 2013

Teresa Stanek Rea
*Acting Director of the United States Patent and Trademark Office*